(12) United States Patent
Hill et al.

(10) Patent No.: US 6,372,643 B1
(45) Date of Patent: Apr. 16, 2002

(54) METHOD FOR FORMING A SELECTIVE CONTACT AND LOCAL INTERCONNECT IN SITU AND SEMICONDUCTOR DEVICES CARRYING THE SAME

(75) Inventors: Christopher W. Hill; Weimin Li; Gurtej S. Sandhu, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/056,309

(22) Filed: Apr. 7, 1998

Related U.S. Application Data

(63) Continuation-in-part of application No. 09/226,053, filed on Jan. 5, 1999, now Pat. No. 6,204,175, which is a continuation of application No. 08/663,996, filed on Jun. 14, 1996, now Pat. No. 5,856,236.

(51) Int. Cl.$^7$ .............................................. H01L 21/44
(52) U.S. Cl. ...................... 438/674; 438/681; 438/683; 438/685; 438/643
(58) Field of Search ................................ 438/641, 627, 438/628, 630, 648, 649, 652, 653, 655, 656, 674, 683, 680, 654, 643, 644, 907, 908, 913, 909, 685, 682, 642, 618, 625, 681; 427/585

(56) References Cited

U.S. PATENT DOCUMENTS

| | | | |
|---|---|---|---|
| 4,822,753 A | * | 4/1989 | Pintchovski et al. ......... 438/643 |
| 4,851,369 A | * | 7/1989 | Ellwanger et al. .......... 438/200 |
| 4,922,311 A | * | 5/1990 | Lee et al. .................. 357/23.1 |

(List continued on next page.)

OTHER PUBLICATIONS

Sherman, Arthur: "Growth and Properties of Low Pressue Chemical Vapor Deposited TiN* for Ultra Large Scale Integration" Japanese Journal of Applied Physics, 12/91, vol. 30, No. 12B.

Sandhu, Gurtej S., Meikle, Scott G., Doan, Trung T.: "Metalorganic Chemical Vapor Deposition of TiN Films for Advanced Metallization", American Institute of Physics, Jan. 18, 1993.

Intemann, A., Koerner, H., Koch, F.: "Film Properties of CVD Titanium Nitride Deposited with Organometallic Precursors at Low Pressure Using Inert Gases, Ammonia, or Remote Activation", The Electrochemical Society, Inc. vol. 140, No. 11, Nov., 1993.

(List continued on next page.)

Primary Examiner—Wael Fahmy
Assistant Examiner—Kurt Eaton
(74) Attorney, Agent, or Firm—TraskBritt

(57) ABSTRACT

A process for the in situ formation of a selective contact and a local interconnect on a semiconductor substrate. The exposed semiconductor substrate regions of a semiconductor device structure may be treated in a plasma to enhance the adhesiveness of a selective contact thereto. The semiconductor device structure is positioned within a reaction chamber, wherein a selective contact is deposited onto the exposed semiconductor substrate regions, Any residual selective contact material may be removed from oxide surfaces either intermediately or after selective contact deposition. While the semiconductor device remains in the reaction chamber, a local interconnect is deposited over the semiconductor device structure. The local interconnect may then be patterned. Subsequent layers may be deposited over the local interconnect. The present invention also includes semiconductor device structures formed by the inventive process.

37 Claims, 2 Drawing Sheets

U.S. PATENT DOCUMENTS

| | | | | |
|---|---|---|---|---|
| 4,951,601 A | * | 8/1990 | Maydan et al. | 118/179 |
| 4,975,756 A | | 12/1990 | Haken et al. | 257/371 |
| 5,087,593 A | | 2/1992 | Narula | 501/96.1 |
| 5,089,438 A | | 2/1992 | Katz | 438/558 |
| 5,139,825 A | | 8/1992 | Gordon et al. | 427/255.2 |
| 5,192,589 A | | 3/1993 | Sandhu | 427/255.1 |
| 5,227,334 A | | 7/1993 | Sandhu | 438/656 |
| 5,231,056 A | | 7/1993 | Sandhu | 438/654 |
| 5,240,739 A | | 8/1993 | Doan et al. | 438/683 |
| 5,246,881 A | | 9/1993 | Sandhu et al. | 438/681 |
| 5,252,518 A | | 10/1993 | Sandhu et al. | 438/681 |
| 5,254,499 A | | 10/1993 | Sandhu et al. | 438/681 |
| 5,278,100 A | | 1/1994 | Doan et al. | 438/681 |
| 5,344,792 A | * | 9/1994 | Sandhu et al. | 438/200 |
| 5,369,055 A | * | 11/1994 | Chung | 438/200 |
| 5,376,405 A | | 12/1994 | Doan et al. | 438/680 |
| 5,399,379 A | | 3/1995 | Sandhu | 427/255.1 |
| 5,416,045 A | | 5/1995 | Kauffman et al. | 438/660 |
| 5,625,231 A | | 4/1997 | Huang et al. | 257/751 |
| 5,716,870 A | * | 2/1998 | Foster et al. | 438/192 |
| 5,739,046 A | * | 4/1998 | Lur et al. | 438/190 |
| 5,801,099 A | * | 9/1998 | Kim et al. | 438/666 |
| 5,834,356 A | * | 11/1998 | Bothra et al. | 438/384 |
| 5,856,236 A | * | 1/1999 | Lai et al. | 438/681 |
| 5,856,237 A | * | 1/1999 | Ku | 438/683 |
| 5,994,220 A | * | 11/1999 | Gonzalez et al. | 438/672 |
| 6,001,729 A | * | 12/1999 | Shinriki et al. | 438/625 |
| 6,020,259 A | * | 2/2000 | Chen et al. | 438/648 |
| 6,221,792 B1 | * | 4/2001 | Yang et al. | 438/776 |

OTHER PUBLICATIONS

Fix, Renaud M., Gordon, Roy G. and Hoffman, David M.: "Synthesis of Thin Films by Atmospheric Pressure Chemical Vapor Deposition Using Amido and Imido Titanium (IV) Compounds as Precursors", Department of Chemistry, Harvard University, Chem Mater. vol. 2 No. 3, 1990, pp. 235–241.

Revesz, A.G., Brown, G.A. Hughes, H.L..: "Bulk Electrical Conduction in the Buried Oxide of SIMOX Structures", The Electrochemical Society, Inc., vol. 140, No. 11, Nov. 1993.

* cited by examiner

METHOD FOR FORMING A SELECTIVE CONTACT AND LOCAL INTERCONNECT IN SITU AND SEMICONDUCTOR DEVICES CARRYING THE SAME

CROSS REFERENCE TO RELATED APPLICATION

This application is a continuation-in-part of application Ser. No. 09/226,053, filed Jan. 5, 1999, U.S. Pat. No. 6,204,175, issued Mar. 20, 2001, which is a continuation of application Ser. No. 08/663,996, filed Jun. 14, 1996, which issued as U.S. Pat. No. 5,856,236 on Jan. 5, 1999.

BACKGROUND OF THE INVENTION

1. Field of the Invention

The present invention relates to processes for forming selective contacts and metal silicide interconnects on semiconductor devices. In particular, the present invention relates to processes wherein a local interconnect, which acts as a barrier layer, is deposited prior to forming an electrical contact, via, or other electrically conductive structure that forms a junction with an active device region. Specifically, the local interconnect and selective contact are formed in situ (i.e., in the same chamber without removing the semiconductor device therefrom between deposition of the interconnect and the selective contact).

2. Background of Related Art

The isolated active regions of a semiconductor device are typically covered with an insulative, or dielectric layer, and are only exposed to the active surface of the semiconductor device by openings through the insulative layer, which are referred to as contact openings, or "contacts" for simplicity. In order for the semiconductor device to function, electrical connections must be established between the various active device regions. Conductive paths or lines are fabricated on the active surface of the semiconductor device to electrically interconnect the active regions of the semiconductor device.

The interconnection of many electrically conductive materials to a semiconductor substrate, however, generates a great deal of contact resistance. In turn, the resistance of such contacts tends to convert some of the electrical energy transmitted therethrough into heat. With the ever-increasing density of integrated circuits carried on semiconductor devices and the ever-increasing size of semiconductor devices, such high levels of contact resistance necessitate increased power input and an increase in the operating temperatures of state-of-the-art semiconductor devices. Consequently, it has become necessary to reduce the contact resistance at the junction of the contact and the conductive path or line that is electrically connected thereto. A principal way of reducing contact resistance includes the formation of a metal silicide layer over the contact prior to the fabrication of the conductive line or path that will be electrically connected thereto. Such metal silicide layers are commonly referred to as selective contacts. Titanium silicide (TiSi$_x$, wherein x is predominantly equal to 2) is a refractory metal silicide that is commonly employed as a selective contact in order to reduce contact resistance. The formation of metal silicide selective contacts typically includes the deposition of a thin layer of titanium and titanium nitride onto the semiconductor device, including the semiconductor substrate of the active device regions that are exposed through the contact openings. A high temperature anneal, such as the type that is known in the art as a rapid thermal anneal (RTA), is then employed, causing the titanium and titanium nitride to react with the semiconductor substrate to form a silicide (i.e., TiSi$_x$) selective contact. This process is said to be self-aligned since the TiSi$_x$ forms only over semiconductor substrate (e.g., silicon and polysilicon) regions. The remaining titanium and titanium nitride which overlies the selective contact acts as an interconnect, or a barrier layer, and prevents the diffusion of silicon and silicide into any electrically conductive material that is subsequently deposited thereover. Everywhere else, the applied titanium film overlies an insulative, substantially non-reactive field oxide layer, and may subsequently be removed.

An exemplary barrier layer is formed of titanium nitride, which is typically blanket deposited over a semiconductor device by the following chemical reaction:

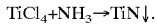

$$TiCl_4 + NH_3 \rightarrow TiN\downarrow.$$

Upon subjecting the semiconductor device to temperatures of about 500° C. or higher (e.g., by a rapid thermal anneal), the deposited titanium reacts with the silicon substrate to form a silicide layer. The silicide layer formed by this process, however, often creates an undesirably thick selective contact junction between the semiconductor substrate beneath and the interconnect above.

Another such process, which is directed to the deposition of metal directly upon the silicon substrate to form a metal silicide film thereon in order to fabricate selective contacts and local interconnects, is disclosed in U.S. Pat. No. 5,416,045 (the "'045 patent"), which issued to Ralph E. Kauffman et al. on May 16, 1995. The process that is disclosed in the '045 patent utilizes nitrogen gas ($N_2$) to facilitate titanium nitride deposition at temperatures of about 500° C. or less by slowing the reaction rate, comparative to other similar processes, to improve step coverage of the titanium nitride layer. The titanium nitride layer is subsequently annealed to the substrate by known rapid thermal anneal techniques in order to form a metal silicide selective contact between the substrate and the titanium nitride layer.

Although the process of the '045 patent reduces problems associated with poor step coverage, it is somewhat undesirable from the standpoint that the titanium nitride layer may consume excessive amounts of the underlying silicon during the rapid thermal anneal, and, in turn, form deeper silicide junctions (i.e., thicker than selective contacts) than are desirable in many electrically conductive structures.

Several other prior art processes include the direct deposition of metal suicides upon the silicon substrate. The following United States Patents disclose exemplary metal silicide deposition techniques: U.S. Pat. No. 5,376,405, issued to Trung T. Doan et al. on Dec. 27, 1994; U.S. Pat. No. 5,278,100, issued to Trung T. Doan et al. on Jan. 11, 1994; and U.S. Pat. No. 5,240,739, issued to Trung T. Doan et al. on Aug. 31, 1993. None of the foregoing patents, however, discuss the subsequent in situ deposition of an interconnect over the metal silicide selective contact.

When a silicide layer is deposited directly onto the active device regions of the semiconductor device that are exposed through contact openings, since many desirable electrically conductive contact opening filling materials, such as tungsten (W), adhere poorly to selective contact materials such as TiSi$_x$, and further because the silicon and many selective contact materials tend to diffuse into many types of contact opening filling materials, an intervening interconnect is often desirable to promote adherence of the contact opening filling material to the underlying substrate. As noted above, interconnects that are manufactured from materials such as titanium nitride provide the additional advantage of inhibiting the diffusion of silicon and silicide into the contact opening filling material, and are therefore typically referred to as barrier layers.

Many interconnect fabrication processes, however, are performed in a separate reaction chamber than that in which the silicide deposition was performed, requiring that the semiconductor devices be transferred between the silicide deposition and the barrier layer deposition. Consequently, the fabrication time, amount of equipment required, and equipment down time are increased, which drives fabrication costs higher.

Accordingly, Applicants have recognized a need for a process of forming conductive structures upon semiconductor substrates, wherein a selective contact of desirable thickness is deposited onto semiconductor substrate material exposed through a contact opening, and an interconnect is subsequently deposited onto the selective contact in situ.

SUMMARY OF THE INVENTION

The present invention addresses the above-identified needs.

The process of the present invention includes the fabrication of selective contacts and local interconnects over the exposed regions of semiconductor substrate (e.g., active device regions) of semiconductor devices. The inventive process includes depositing a selective contact, such as a thin metal silicide layer, which is also referred to as a salicide layer, onto a semiconductor substrate, such as silicon or polysilicon. Following deposition of the selective contact, and in situ therewith (i.e., in the same deposition chamber), an interconnect, which is also referred to as a barrier layer, is deposited over the selective contact. A layer of electrically conductive material may then be deposited over the interconnect to define an electrically conductive structure.

The inventive process may also include plasma treatment of the active region prior to deposition of the selective contact. Plasma treatment of the active region improves adherence of the selective contact to the active region, as well as enhances the deposition selectivity for the active region while fabricating the selective contact.

The process of the present invention may also include cleaning residual selective contact material from the field oxide surfaces of the semiconductor device. Such cleaning may be performed either after the selective contact has been fabricated, or during fabrication of the selective contact, between selectively depositing first and second selective contact layers over the semiconductor substrate.

Semiconductor devices which include a selective contact and an interconnect that are formed by the inventive process are also within the scope of the present invention.

Other advantages of the present invention will become apparent to those of ordinary skill in the relevant art through a consideration of the appended drawings and the ensuing description.

DETAILED DESCRIPTION OF THE PREFERRED EMBODIMENTS

Figure 1:
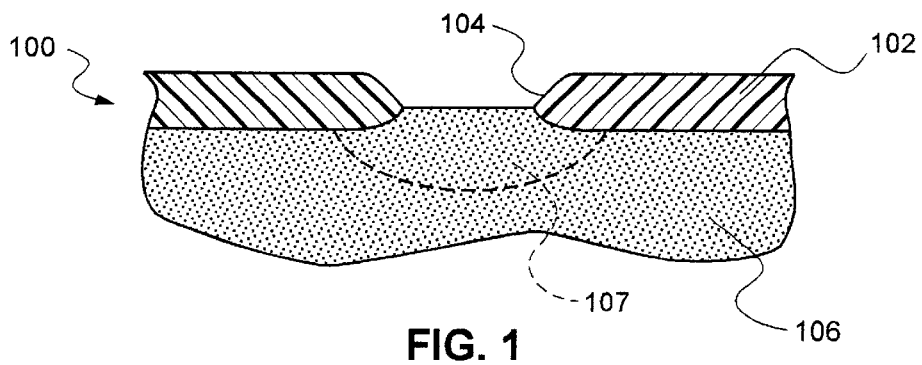
FIG. 1 is a cross-sectional view of a semiconductor device, depicting an active device region and the surrounding field oxide layer.
Figure 4:
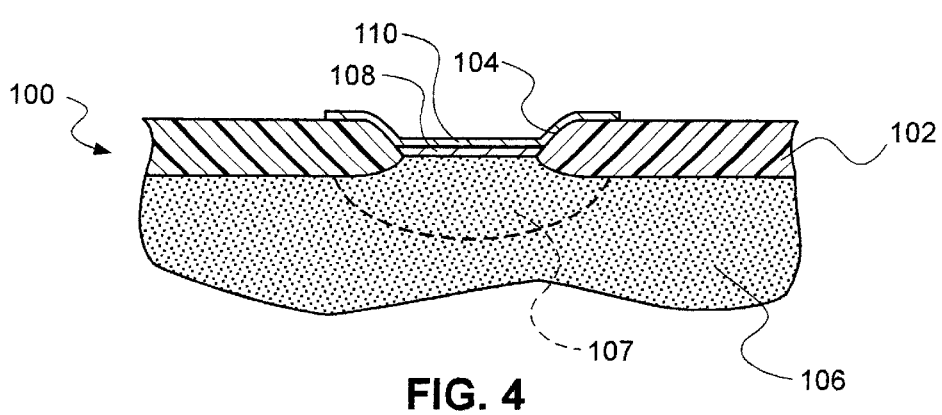
FIG. 4 is a cross-sectional view of a semiconductor device, depicting the interconnect of FIG. 3 after patterning.

Referring to FIG. 1, a semiconductor device 100 is shown which includes a field oxide layer 102 that defines a contact opening 104, which is also referred to as a contact for simplicity, over a semiconductor substrate 106, such as a silicon or polysilicon active device region 107. With reference to FIG. 4, the process of the present invention includes the fabrication of a selective contact 108 and an interconnect 110, which is also referred to as an intervening layer or a barrier layer, over semiconductor substrate 106 of semiconductor device 100. Selective contact 108 and interconnect 110 are deposited in the same reaction chamber. Interconnect 110 may then be patterned (e.g., by masking and etching) by removing the interconnect material from field oxide layer 102 overlying semiconductor substrate 106. Alternatively, an electrically conductive layer, which is referred to as contact fill 114, (see FIG. 5) may be deposited over interconnect 110 prior to patterning.

Referring again to FIG. 1, the field oxide layer 102, contact opening 104 and active device region 107 of semiconductor device 100 are each formed by techniques that are known in the art.

Semiconductor substrate 106 may be treated prior to the fabrication of selective contact 108 thereon. An exemplary method of treatment includes the generation of a plasma (e.g., a plasma which includes activated species of nitrogen, ammonia, hydrogen, or a combination thereof) over semiconductor device 100. Such treatment enhances the selectivity of the subsequently deposited selective contact 108 for the semiconductor substrate 106. Preferably, treatment of semiconductor substrate 106 occurs in a separate reaction chamber than the subsequent deposition steps in order to ensure the integrity of selective contact 108. Thus, if the exposed semiconductor substrate 106 regions are treated in such a manner, semiconductor device 100 is transferred to a separate reaction chamber for deposition of selective contact 108 and interconnect 110.

Figure 2:
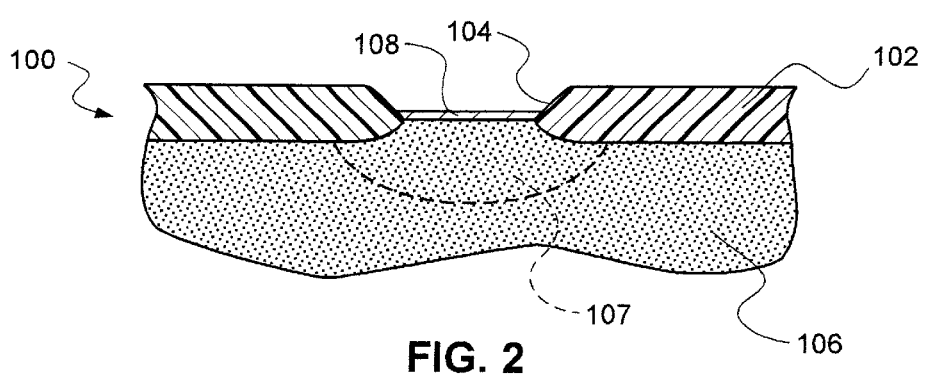
FIG. 2 is a cross-sectional view of a semiconductor device, depicting a selective contact that has been fabricated over the active device region in accordance with the method of the present invention.

FIG. 2 illustrates a selective contact 108 that has been deposited over the exposed semiconductor substrate 106. Selective contact 108 may be fabricated from materials which have low resistance, which may be selectively deposited onto the semiconductor substrate 106 and which generate little contact resistance, relative to that generated between direct metal-to-silicon contacts, when placed into contact with the semiconductors of the active device region, such as silicon or polysilicon. Preferably, selective contact 108 is formed of a metal silicide. One such material is titanium silicide ($TiSi_x$), which predominantly includes the species $TiSi_2$. Other suicides that are useful for fabricating selective contacts include the silicides of tungsten (predominantly $WSi_2$), molybdenum (predominantly $MoSi_2$) and platinum (predominantly $PtSi_2$).

A metallic precursor and a silicon-containing compound, which are collectively referred to as first reactants, chemically react with one another to form selective contact 108.

When titanium silicide selective contacts 108 are desired, a chemical reaction occurs in a reaction chamber, such as a chemical vapor deposition (CVD) chamber between a set of reactants. Preferably, a titanium tetrahalide, such as titanium tetrachloride (TiCl$_4$), is reacted with either silane (SiH$_4$) or dichlorosilane (DCS, SiH$_2$Cl$_2$) as follows:

$$TiCl_4 + SiH_4 \rightarrow TiSi_2 \downarrow$$

$$TiCl_4 + SiH_2Cl_2 \rightarrow TiSi_2 \downarrow$$

In order to optimize the selectivity of these titanium silicide deposition reactions for the semiconductor substrate 106, which is exposed through contact opening 104, a deposition temperature in the range of about 650° C. to about 750° C. is preferable. Since minimal amounts of the semiconductor substrate 106 are consumed by these reactions, the deposition reaction is allowed to continue until a selective contact 108 of the desired thickness is formed.

Alternatively, a titanium halide and/or a gaseous titanium organometallic precursor may be reacted with a silicon-containing compound of the formula Si$_n$H$_{2n+2}$ in order to form a silicide selective contact 108, as is disclosed in U.S. Pat. No. 5,240,739, issued to Trung Doan et al. on Aug. 31, 1993; U.S. Pat. No. 5,278,100, issued to Trung Doan et al. on Jan. 11, 1994; and U.S. Pat. No. 5,376,405, issued to Trung Doan et al. on Dec. 27, 1994, the disclosures of each of which are hereby incorporated by reference in their entirety. Exemplary chemical reactions include:

$nTiCl_4 + Si_nH_{2n+2} \rightarrow nTiSi + 4nHCl + H_2 + \text{by-products}$;

$nTiCl_4 + 2Si_nH_{2n+2} \rightarrow nTiSi + 4nHCl + 2H_2 + \text{by-products}$;

$TiCl_4 + Si_nH_{2n+2} \rightarrow Ti_5Si_3 + HCl + H_2 + \text{by-products}$;

$TDMAT + Si_2H_6 \rightarrow TiSi_2 + \text{organic by-products}$;

$TDMAT + Si_nH_{2n+2} \rightarrow (n/2)TiSi_2 + \text{organic by-products}$; and $Ti(NR_2)_4 + SiH_4 \rightarrow TiSi_x + TiSi_yN_{1-y} + \text{organic by-products}$, where x is predominantly equal to two, y is zero or one and n is an integer equal to zero or more.

An exemplary reaction between TiCl$_4$ and Si$_2$H$_6$ may deposit selective contact 108 at a temperature as low as about 400° C. Another exemplary reaction, between TiCl$_4$ and Si$_3$H$_8$, deposits a silicide selective contact 108 at temperatures of about 300° C. and higher.

Titanium halides that may be employed in the deposition of selective contact 108 include, without limitation, TiCl$_4$, titanium tetraboride, titanium tetrafluoride, titanium tetraiodide, and subhalides. Titanium organometallic precursors which may be used to fabricate selective contact 108 include, but are not limited to compounds of the formula Ti(NR$_2$)$_4$, where the titanium atom is bonded to the nitrogen atom and R comprises hydrogen or a carbon-containing radical. Exemplary compounds include tetradimethylamido titanium (TDMAT or Ti(N(CH$_3$)$_2$)$_4$ and Ti(N(C$_2$H$_5$)$_2$)$_4$.

Although silicide deposition is selective for semiconductor substrate 106, residual metal silicide may be deposited onto field oxide layer 102. Thus, cleaning of semiconductor device 100 may be desirable in order to remove any residual metal silicide from field oxide layer 102. Cleaning agents such as chlorine (Cl$_2$), hydrochloric acid (HCl) and hydrofluoric acid (HF) may be employed to clean any residual metal silicides from field oxide layer 102 by known cleaning techniques, including without limitation thermal gas, plasma assisted, and remote plasma activated cleaning.

Such cleaning techniques may be performed following deposition of selective contact 108, or intermediately, wherein a thin layer of selective contact material is deposited onto the exposed region 107 of semiconductor substrate 106, any residual metal suicides are cleaned from field oxide layer 102, then the remainder of the selective contact material is deposited. Preferably, any such cleaning is performed in the same reaction chamber as the fabrication of selective contact 108.

Figure 3:
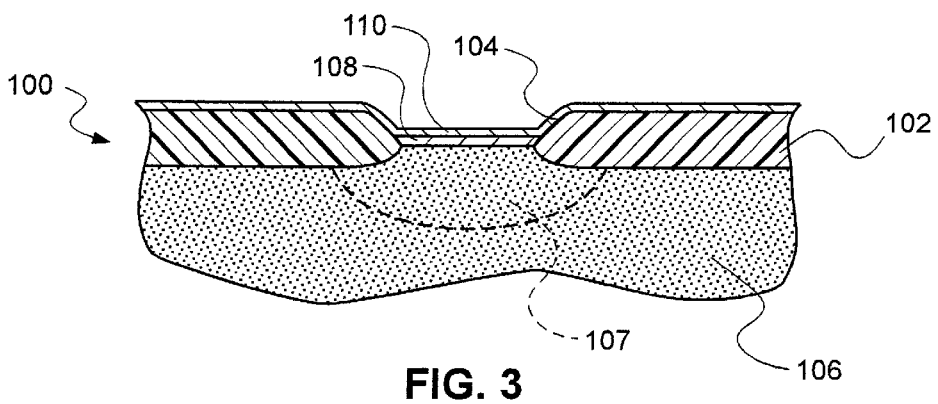
FIG. 3 is a cross-sectional view of a semiconductor device, depicting an interconnect layer that has been blanket-deposited over the selective contact in accordance with the method of the present invention.

Referring now to FIG. 3, upon depositing a selective contact 108 of the desired thickness, the introduction of a silicon source (e.g., silane or DCS) into the reaction chamber is terminated, and the deposition of interconnect 110 is initiated while semiconductor device 100 remains in the reaction chamber. A metallic precursor and another reactant, which are collectively referred to as second reactants, are introduced into the reaction chamber to deposit interconnect 10 onto semiconductor device 100. Preferably, the metallic precursor, which is preferably TiCl$_4$, is reacted with ammonia (NH$_3$) to initiate the following chemical reaction, which deposits an interconnect 110 (see FIG. 3) of titanium nitride (TiN) over the surface of semiconductor device 100:

$$TiCl_4 + NH_3 \rightarrow TiN \downarrow,$$

including field oxide layers 102 and selective contacts 108 (i.e., a blanket deposition occurs). The duration of the foregoing reaction is dependent upon the desired thickness of interconnect 110. This reaction may also be carried out in the presence of nitrogen gas (N$_2$), as discussed in U.S. Pat. No. 5,416,045 (the "'045 patent"), issued to Kauffman et al. on May 16, 1995, the disclosure of which is hereby incorporated by reference in its entirety. As explained in the '045 patent, nitrogen gas facilitates the deposition of titanium nitride at temperatures of about 500° C. or lower. Hydrogen gas (H$_2$) may also be introduced into the reaction chamber to facilitate the formation of hydrochloric acid from chlorine.

Other chemical reactions are also useful for depositing interconnect 110. U.S. Pat. No. 5,399,379, issued to Gurtej S. Sandhu on Mar. 21, 1995, the disclosure of which is hereby incorporated by reference in its entirety, describes such a reaction, whereby one or more organometallic compounds of the formula Ti(NR$_2$)$_4$, which is also referred to as a tetrakis-dialkylamido-titanium, are reacted with a halide gas (e.g., F$_2$, Cl$_2$, Br$_2$) to form a titanium nitride film on a semiconductor device. In each Ti(NR$_2$)$_4$ molecule, the titanium atom is single-bonded to four nitrogen atoms, each of which are also single-bonded to two R groups, which include hydrogen atoms or alkyl groups.

Another exemplary titanium nitride deposition reaction is disclosed in U.S. Pat. No. 5,254,499 (the "'499 patent"), issued to Gurtej S. Sandhu et al. on Oct. 19, 1993, the disclosure of which is hereby incorporated by reference in its entirety. According to the '499 patent, a titanium nitride layer may also be deposited by reacting one or more compounds of the general formula Ti(NR$_2$)$_4$, where the titanium atom is bonded to the nitrogen atom which is in turn bonded to two hydrogen atoms or a carbon-containing radical (R), with ammonia (NH$_3$). The following United States Patents disclose various other methods for depositing titanium nitride films, wherein the second reactants are Ti(NR$_2$)$_4$ and ammonia: U.S. Pat. Nos. 5,192,589, issued to Gurtej S. Sandhu on Mar. 9, 1993; 5,139,825, issued to Roy G. Gordon et al. on Aug. 18, 1992; and 5,089,438, issued to Avishay Katz on Feb. 18, 1992, the disclosures of each of which are hereby incorporated by reference in their entirety.

U.S. Pat. No. 5,246,881, issued to Gurtej S. Sandhu et al. on Sep. 21, 1993, the disclosure of which is hereby incorporated by reference in its entirety, discloses another method for depositing a titanium nitride film, wherein the second reactants are one or more compounds of the formula Ti(NR$_2$)$_4$, where the titanium atom is bonded to the nitrogen atom which is in turn bonded to two hydrogen atoms or a carbon-containing radical (R), and an activated species which attacks the R-nitrogen bonds of the $Ti(NR_2)_4$, and which will convert the activated species to a volatile compound. The activated species include halogens, ammonia, and hydrogen, and are radiofrequency (RF) activated remote from the $Ti(NR_2)_4$.

Another titanium nitride deposition reaction that is useful in the method of the present invention is disclosed in U.S. Pat. No. 5,227,334, issued to Gurtej S. Sandhu on Jul. 13, 1993, which is hereby incorporated by reference in its entirety. The second reactants of that process include a titanium-containing compound, such as $Ti(NR_2)_4$, and nitrogen trifluoride ($NF_3$).

Alternatively, the interconnect may be formed from a mixed phase layer, such as the $TiN/TiSi_x$ layer formed by the method disclosed in U.S. Pat. No. 5,525,518 (the "'518 patent), issued to Gurtej S. Sandhu et al. on Oct. 12, 1993, the disclosure of which is hereby incorporated by reference in its entirety. The process of the '518 patent includes reacting $Ti(NR_2)_4$, where the titanium atom is bonded to the nitrogen atom which is in turn bonded to two hydrogen atoms or a carbon-containing radical (R), with an organic silane reactive gas, such as tris(dimethylamino) silane (SIN).

Preferably, the selective contact reaction between first reactants and the interconnect reaction between second reactants include at least one common reactant.

Referring now to FIG. 4, after interconnect 110 has been deposited onto semiconductor device 100, it may be patterned by techniques that are known in the art, such as masking and etching, in order to define a desired structure therefrom.

Figure 5:
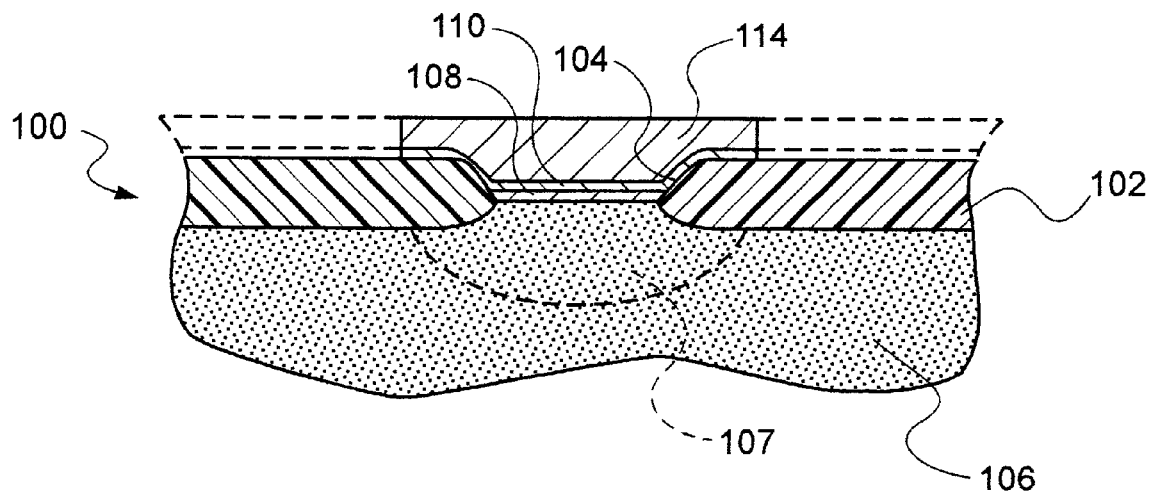
FIG. 5 is a cross-sectional view of a semiconductor device, wherein an electrically conductive contact fill layer has been fabricated over the interconnect of FIG. 3 and patterned.

Alternatively, as seen in FIG. 5, an electrically conductive layer of contact fill 114 may be deposited over interconnect 110 prior to patterning. Electrically conductive layer of contact fill 114 may be deposited by any processes that are known to those of skill in the art. Contact fill 114 and interconnect 110 may then be patterned by techniques that are known in the art, such as masking and etching.

Figure 6:
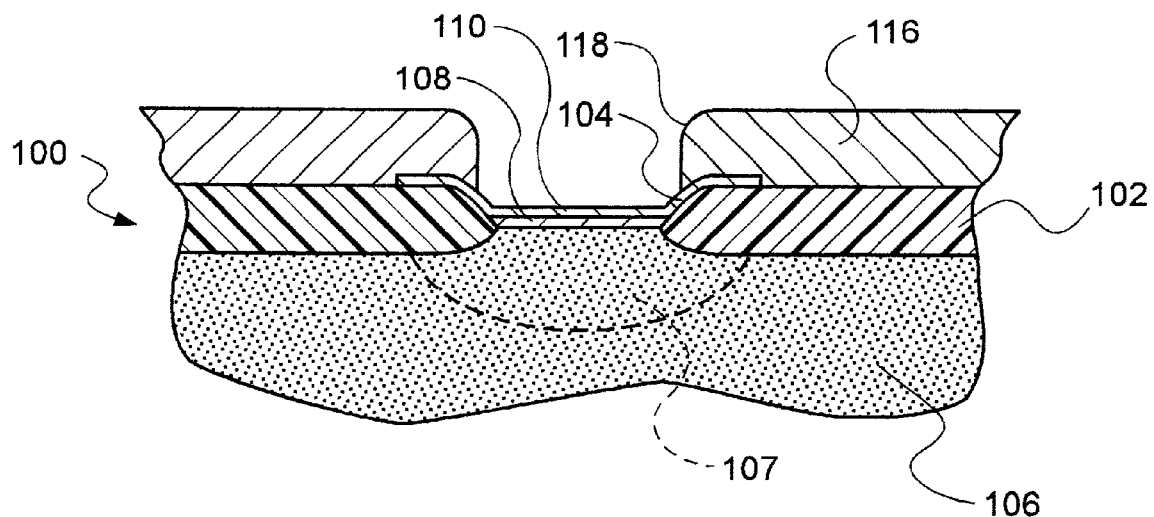
FIG. 6 is a cross-sectional view of a variation of an electrically conductive structure formed by the process of the present invention.

With reference to FIG. 6, interconnect 110 may also act as an etch stop layer when any subsequently deposited layers are patterned thereover, such as in structures where an interlayer dielectric 116 is deposited over interconnect 110, then patterned, such as by masking and etching techniques that are known to those in the art, to create a contact opening 118 to expose the interconnect.

Alternatively, interconnect 110 may be deposited by selective techniques, as known in the art, that will permit the in situ deposition of selective contact 108 and interconnect 110. Similarly, by employing processes that are known in the art, contact fill 114 may be selectively deposited onto interconnect 110. An exemplary process that may be used for the selective deposition of interconnect 110 and/or contact fill 114 that is known in the art is the selective chemical vapor deposition (CVD) of tungsten, which is a two-step process including the reduction of $WF_6$ by silicon and the subsequent reduction of $WF_6$ by $H_2$. The hydrogen reduction is carried out under conditions in which the tungsten deposits only on the tungsten layer that was deposited during the first step, including a lower deposition temperature, lower total and partial pressures of $WF_6$, fewer semiconductor wafers in the reaction chamber, a reduced selective deposition area on the wafer, shorter deposition times, and the use of wafers with an undamaged silicon dioxide layer.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method of fabricating an electrically conductive structure on a semiconductor device, comprising:
   selectively depositing a self-aligned metal silicide contact directly onto an exposed, doped area of a semiconductor substrate of the semiconductor device without substantially depositing material onto locations of the semiconductor device laterally adjacent said exposed, doped area; and
   depositing an interconnect onto said contact in situ with said selectively depositing said contact.

2. The method of claim 1, further comprising exposing said exposed, doped area of semiconductor substrate to a plasma.

3. The method of claim 2, wherein said plasma comprises an activated species of nitrogen, ammonia, or hydrogen.

4. The method of claim 1, further comprising cleaning said semiconductor device during said fabricating said self-aligned metal silicide contact.

5. The method of claim 4, wherein said cleaning employs a cleaning agent selected from the group consisting of chlorine, hydrochloric acid and hydrofluoric acid.

6. The method of claim 1, further comprising cleaning said semiconductor device after said selectively depositing said self-aligned metal silicide contact.

7. The method of claim 6, wherein said cleaning employs a cleaning agent selected from the group consisting of chlorine, hydrochloric acid and hydrofluoric acid.

8. The method of claim 1, wherein said selective contact comprises titanium silicide.

9. The method of claim 1, wherein said depositing said interconnect comprises blanket depositing said interconnect.

10. The method of claim 1, wherein said depositing said interconnect comprises selectively depositing said interconnect.

11. The method of claim 1, further comprising patterning said interconnect.

12. The method of claim 1, further comprising depositing a layer of electrically conductive material onto the semiconductor device.

13. The method of claim 12, further comprising patterning said layer of electrically conductive material.

14. The method of claim 1, wherein said depositing said interconnect comprises depositing a material selected from the group consisting of titanium and titanium nitride.

15. The method of claim 1, wherein said selectively depositing said self-aligned metal silicide contact comprises reacting a metallic precursor with a silicon-containing compound.

16. The method of claim 15, wherein said reacting comprises reacting a metallic precursor selected from the group consisting of titanium tetrahalides, subhalides, and $Ti(NR_2)_4$, where R is selected from the group consisting of hydrogen and alkyl groups, with said silicon-containing compound.

17. The method of claim 15, wherein said reacting comprises reacting said metallic precursor with a silicon-containing compound is selected from the group consisting of silane, dichlorosilane and $Si_nH_{2n+2}$, where n is an integer equal to zero or more.

18. The method of claim 1, wherein said depositing said interconnect comprises reacting a metallic precursor with a reactant selected from the group consisting of ammonia, nitrogen trifluoride, organic silane reactive gases, and activated species.

19. The method of claim 18, wherein said reacting comprises reacting a metallic precursor selected from the group consisting of titanium tetrahalides and $Ti(NR_2)_4$, where R is selected from the group consisting of hydrogen and alkyl groups with said reactant.

20. A process for fabricating a selective contact and a local interconnect on a semiconductor device, comprising:

selectively depositing a layer of selective contact material directly onto a semiconductor substrate of an exposed active device region of the semiconductor device without substantially depositing material onto locations of the semiconductor device laterally adjacent said exposed active device region; and depositing an interconnect onto said layer of selective contact material in situ with said selectively depositing said layer of selective contact material.

21. The process of claim 20, further comprising exposing said semiconductor substrate to a plasma.

22. The process of claim 21, wherein said exposing comprises exposing said semiconductor substrate to a nitrogen-ammonia plasma.

23. The process of claim 20, further comprising depositing an electrically conductive layer onto said interconnect.

24. The process of claim 20, wherein said depositing said interconnect comprises selectively depositing said interconnect.

25. The process of claim 20, wherein said depositing said interconnect comprises blanket depositing said interconnect.

26. The process of claim 25, further comprising patterning said interconnect.

27. A method of fabricating an electrically conductive structure on an expose, doped portion of a semiconductor device structure, comprising:

placing the semiconductor device structure in a reaction chamber;

injecting a plurality of first reactants into said reaction chamber;

maintaining said reaction chamber at a pressure and temperature that are effective for reacting said first reactants to deposit a metal silicide film directly onto the exposed, doped portion of the semiconductor device structure and reacting said plurality of first reactants without substantially depositing material onto locations of the semiconductor device structure laterally adjacent said exposed, doped portion;

injecting a plurality of second reactants into said reaction chamber following said reacting said first reactants; and maintaining said reaction chamber at a pressure and temperature that are effective for reacting said second reactants to deposit an interconnect on said metal silicide film.

28. The method of claim 25, further comprising exposing the semiconductor device structure to a plasma.

29. The method of claim 28, wherein said exposing comprises exposing the semiconductor device structure to a nitrogen-ammonia plasma.

30. The method of claim 25, further comprising patterning said interconnect.

31. The method of claim 25, further comprising depositing an electrically conductive layer onto the semiconductor device structure.

32. The method of claim 31, further comprising patterning said electrically conductive layer.

33. The method of claim 25, wherein said injecting said plurality of first reactants comprises injecting a metallic precursor and a silicon-containing compound.

34. The method of claim 33, wherein said metallic precursor is selected from the group consisting of titanium tetrahalides, subhalides and $Ti(NR_2)_4$, where R is selected from the group consisting of hydrogen and alkyl groups.

35. The method of claim 33, wherein said silicon-containing compound is selected from the group consisting of silane, dichlorosilane and $Si_nH_{2n+2}$, where n is an integer equal to zero or more.

36. The method of claim 25, wherein said injecting said plurality of second reactants comprises injecting a metallic precursor and a reactant selected from the group consisting of ammonia, nitrogen trifluoride, organic silane reactive gases, and activated species.

37. The method of claim 36, wherein said metallic precursor is selected from the group consisting of titanium tetrahalides and $Ti(NR_2)_4$, where R is selected from the group consisting of hydrogen and alkyl groups.

* * * * *

UNITED STATES PATENT AND TRADEMARK OFFICE
CERTIFICATE OF CORRECTION

PATENT NO. : 6,372,643 B1
DATED : April 16, 2002
INVENTOR(S) : Christopher W. Hill, Weimin Li and Gurtej S. Sandhu It is certified that error appears in the above-identified patent and that said Letters Patent is hereby corrected as shown below:

<u>Column 2,</u>
Line 44, change "suicides" to -- silicides --

<u>Column 5,</u>
Line 67, change "suicides" to -- silicides --

<u>Column 6,</u>
Line 13, change "10" to -- 110 --

<u>Column 8,</u>
Line 22, after "of" and before "semiconductor" insert -- said --
Line 27, change "fabricating" to -- selectively depositing --

<u>Column 9,</u>
Line 10, insert a comma after "groups"

Signed and Sealed this

Thirtieth Day of September, 2003

JAMES E. ROGAN
*Director of the United States Patent and Trademark Office*